United States Patent
Batruni

(10) Patent No.: US 7,394,413 B2
(45) Date of Patent: *Jul. 1, 2008

(54) REDUCED COMPLEXITY NONLINEAR FILTERS FOR ANALOG-TO-DIGITAL CONVERTER LINEARIZATION

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/580,463

(22) Filed: Oct. 13, 2006

(65) Prior Publication Data

US 2007/0030189 A1    Feb. 8, 2007

Related U.S. Application Data

(63) Continuation of application No. 11/090,931, filed on Mar. 24, 2005, now Pat. No. 7,142,137.

(60) Provisional application No. 60/556,663, filed on Mar. 25, 2004.

(51) Int. Cl.
H03M 1/06 (2006.01)

(52) U.S. Cl. .................. 341/118; 341/119; 341/120; 341/155

(58) Field of Classification Search ............. 341/118, 341/155, 119, 120, 117
See application file for complete search history.

(56) References Cited

U.S. PATENT DOCUMENTS 5,940,138 A * 8/1999 Lowe .................. 348/574

| | | | | |
|---|---|---|---|---|
| 6,351,227 B1 * | 2/2002 | Rudberg | .................. | 341/118 |
| 6,943,620 B2 * | 9/2005 | Andersen et al. | .............. | 330/10 |
| 7,023,941 B1 * | 4/2006 | Rey et al. | .................. | 375/355 |
| 7,142,137 B2 * | 11/2006 | Batruni | .................. | 341/118 |
| 2004/0228416 A1 * | 11/2004 | Anderson et al. | .......... | 375/247 |

FOREIGN PATENT DOCUMENTS

EP        1 162 732 A2    12/2001
WO    WO 2005/006559 A1    1/2005

OTHER PUBLICATIONS

Hummels et al. "Using Adjacent Sampling for Error Correcting Analog-to-Digital Converters" Proceedings of the International Symposium on Circuits and Systems. San Diego, May 10-13, 1992, Proceedings of the International Symposium on Circuits and Systems. (ISCAS), New York, IEEE, US, vol. 4 Conf. 25, May 23, 1992, pp. 589-592, XP010061267 ISBN: 0-7803-0593-0.

* cited by examiner

*Primary Examiner*—Jean B Jeanglaude
(74) *Attorney, Agent, or Firm*—Van Pelt, Yi & James LLP

(57) ABSTRACT

A method of converting an input analog signal to a compensated digital signal comprises converting the input analog signal to an uncompensated digital signal, inputting the uncompensated digital signal to a distortion model, generating a modeled distortion signal based on the uncompensated digital signal, and subtracting the modeled distortion signal from the uncompensated digital signal to generate the compensated digital signal. A distortion compensating analog to digital converter (ADC) comprises an uncompensated ADC configured to convert an input analog signal to an uncompensated digital signal, and a compensation module coupled to the uncompensated ADC, configured to receive the uncompensated digital signal, generate a modeled distortion signal based on the uncompensated digital signal and subtract the modeled distortion signal from the uncompensated digital signal to generate the compensated digital signal.

6 Claims, 7 Drawing Sheets

REDUCED COMPLEXITY NONLINEAR FILTERS FOR ANALOG-TO-DIGITAL CONVERTER LINEARIZATION

CROSS REFERENCE TO OTHER APPLICATIONS

This application is a continuation of U.S. patent application Ser. No. 11/090,931, entitled REDUCED COMPLEXITY NONLINEAR FILTERS FOR ANALOG-TO-DIGITAL CONVERTER LINEARIZATION filed Mar. 24, 2005 which is incorporated herein by reference for all purposes, now U.S. Pat. No. 7,142,137 which claims priority to U.S. Provisional Application No. 60/556,663, entitled REDUCED COMPLEXITY NONLINEAR FILTERS FOR ANALOG-TO-DIGITAL CONVERTER LINEARIZATION filed Mar. 25, 2004 which is incorporated herein by reference for all purposes.

BACKGROUND OF THE INVENTION

Analog-to-digital converters (ADCs) have a wide range of applications. Applications such as high speed communication systems often require ADCs with low distortion or linear distortion that may be corrected using known techniques. In practice, the outputs of many ADCs have nonlinear distortion in addition to quantization error inherent in the conversion of an analog signal to a digital signal. There are many causes for the nonlinear distortion, including nonlinear components such as inductors, capacitors and transistors, nonlinear gate transconductance, gain errors in amplifiers, digital to analog converter level errors, etc. Nonlinear ADCs often have variable time constants that change with the input. Changes in time constants may depend on the input, the rate of change for the input (also referred to as slew rate), as well as external factors such as temperature. The effects of the changing time constants are often more pronounced in high speed ADCs where the slew rate change in the input is high. To improve nonlinear distortion, some of the existing ADC designs use physical components that are less sensitive to input changes. This approach, however, is not always effective. Some nonlinearity in the physical components is usually unavoidable, which means that the ADC typically will have some nonlinearity. Furthermore, the special components often lead to more complicated design and higher device cost.

It would be useful if the nonlinear distortion in ADCs could be more easily compensated. It would also be desirable if the compensation technique would not significantly increase the complexity and cost of the ADCs.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A method and system of converting an input analog signal to a compensated digital signal is disclosed. In some embodiments, the input analog signal is converted to an uncompensated digital signal. The uncompensated digital signal is sent to a distortion model and a modeled distortion signal is generated. The modeled distortion signal is subtracted form the uncompensated digital signal to generate the compensated digital signal. In some embodiments, fractional phase samples and/or derivatives of the input are used to generate the modeled distortion signal.

Figure 1A:
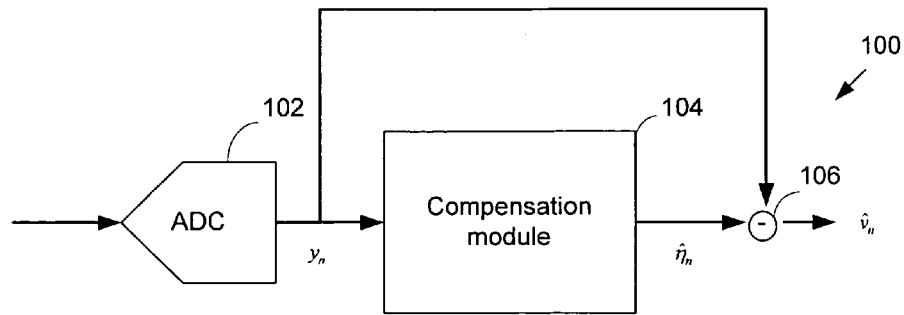
FIG. 1A is a diagram illustrating an embodiment of an analog-to-digital converter.

FIG. 1A is a diagram illustrating an embodiment of an analog-to-digital converter. In this example, ADC 100 is a compensating ADC. It includes an uncompensated ADC 102 and a compensation module 104. ADC 102 and compensation module may be implemented as software or firmware code embedded in a processor, a field programmable gate array (FPGA), a programmable digital processing engine (DSP), an application specific integrated circuit (ASIC), or any other appropriate techniques. The output of ADC 102, $y_n$, has some nonlinear distortion that requires correction $y_n$ is sent to compensation module 104, which generates an estimated distortion $\hat{\eta}_n$. Optionally, the input to the ADC may also be sent to compensation module 104. Combiner 106 subtracts the estimated distortion from the output.

Figure 1B:
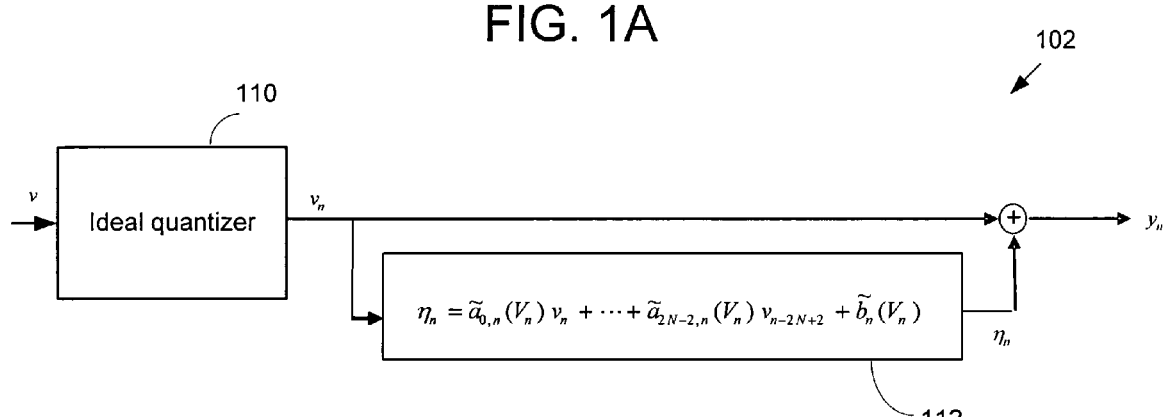
FIG. 1B is a block diagram illustrating a model of ADC 102.

FIG. 1B is a block diagram illustrating a model of ADC 102. In this example, ADC 102 is modeled as an ideal quantizer 110 and a nonlinear distortion filter 112. Ideal quantizer 110 performs sample and hold operation on the analog input to generate an ideal quantized signal $v_n$. The ideal quantized signal is equal to the input minus the quantizer's quantization error (i.e. the portion of the analog signal below the finest ADC quantization level). Nonlinear distortion filter 112 is used to illustrate the distortion function of ADC 102. The distortion function is denoted as $\eta_n$. Unlike quantization error, which typically cannot be reduced for an ADC with a predefined number of bits, the distortion can be compensated using techniques described herein. The overall ADC output is expressed as $y_n = v_n + \eta_n$.

Figure 1C:
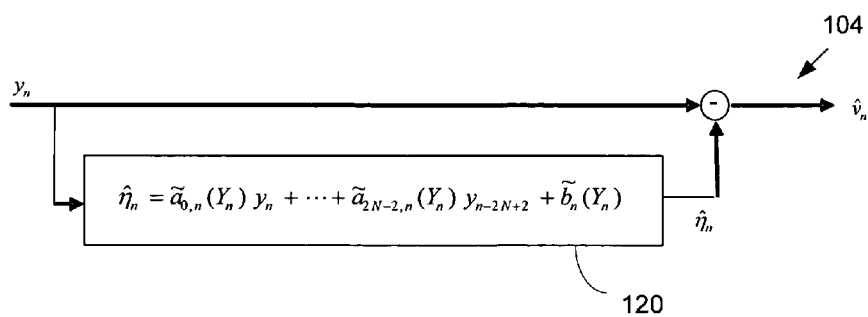
FIG. 1C is a block diagram illustrating an example embodiment of compensation module 104.

FIG. 1C is a block diagram illustrating an example embodiment of compensation module 104. In this example, compensation module 104 includes a distortion modeling filter 120 that implements a distortion model function $\hat{\eta}_n$ that is substantially similar to the ADC's distortion function $\eta_n$. The output of filter 120 is subtracted from the ADC output, $y_n$.

In the examples shown above, a signal entering the ADC propagates in continuous-time mode through several analog circuit components before being sampled and held at a sampling capacitor. The sampled signal is compared with a set of pre-stored voltage (or current) levels and the results of the comparisons are converted to digital bits that form the output of the ADC. The dynamic signal path extends from the ADC's input pad to the sampling capacitor(s). The sample-and-hold function places on the sampling capacitor(s) a charge proportional to the input signal level at the time the sampling switch opens. After the charge is placed, the signal is no longer processed in the continuous-time domain. It is processed in the discrete-time domain and the signal path becomes static. As used in this specification, the distortions in the continuous-time path and the discrete-time path are referred to as dynamic distortion and static distortion respectively.

The dynamic distortion is a function of the continuous-time signal v(t) propagating through a nonlinear analog medium. The analog signal paths have one or more resistor-capacitor (RC) time constants $\tau_1, \tau_2 \ldots \tau_L$. The dynamic nonlinear distortion in ADCs are due to RC time constants that change as functions of the continuous-time signal and its history, i.e., $\tau_1(v(t), v(t-\epsilon), v(t-2\epsilon), \ldots), \tau_2(v(t), v(t-\epsilon), v(t-2\epsilon), \ldots), \ldots, \tau_L(v(t), v(t-\epsilon), v(t-2\epsilon), \ldots)$, where $\epsilon$ is an small time increment. In other words, the dynamic nonlinear distortion is a function of the signal value at time t, the signal value immediately preceding time t at t–$\epsilon$, and the signal value immediately preceding t–$\epsilon$ and so on. The dynamic nonlinear distortion is therefore a function of the signal v(t) and its rate of change $\dot{v}(t)$ (also referred to as derivative or slew rate). The analog signal path also contains linear distortion that generates memory effects on the distortion, causing the nonlinear distortion to be a function of v(t), v(t–ξ), ... and $\dot{v}(t), \dot{v}(t-\xi), \ldots$ where ξ is a discrete time step and a high sampling-rate.

Take the following dynamic nonlinear distortion function for example:

$$y(t) = v(t) + k_1(v(t))(y(t-\xi) - x(t)) + k_2 \arctan(v(t)) \quad \text{(equation 1)},$$

where $k_1(v(t))$ is the filter constant that is a varying fiction of the signal input level, and $k_2 \arctan(v(t))$ is a continuous-time, nonlinear distortion function. This equation can be approximated by $$y(t) = v(t) + k_1(v(t))(\dot{v}(t)) + k_2 \arctan(v(t)) \quad \text{(equation 2)}.$$

When linear distortion is severe enough to cause analog signal path bandwidth limitations and consequently memory effects on the nonlinear distortion, the previous equation can be written as:

$$y(t) = v(t) + k_1(v(t))(\dot{v}(t)) + k_1^{-1}(v(t-\xi))(\dot{v}(t-\xi)) + k_2 \arctan(v(t)) + k^{21} \arctan(v(t-\xi)) \quad \text{(equation 3)}.$$

After the sample-and-hold function, the signal is discretized, and the static distortion is a function of the signal level at the sampling instant and the history of the signal levels at previous sampling instants. Thus, the distortion can be expressed as:

$$f(y(nT), y((n-1)T), \ldots y((n-L)T)) \Leftrightarrow f(v(nT), v((n-1)T), v((n-2)T), \ldots v(nT-\xi), v(nT-2\xi), v(nT-3\xi), \ldots \dot{v}(nT), \dot{v}(nT-\xi), \dot{v}(nT-2\xi), \ldots) \quad \text{(equation 4)}.$$

A general expression for the distortion function is the following:

$$\eta_n = v_n + a_0^0 v_n + a_1^0 v_n v_{n-\xi} + a_2^0 v_{n-2\xi}^3 + \ldots + a_k^0 \dot{v}_n v_{n-k\xi} + a_0^1 \dot{v}_n^3 + a_1^1 \dot{v}_{n-\xi} + a_2^1 \dot{v}_{n-2\xi} + \ldots + a_k^1 \dot{v}_{n-k\xi} + a_0^2 v_{n-1} + a_1^2 v_{n-2} + a_2^2 v_{n-3} + \ldots + a_n^2 v_{n-k-1} + b \quad \text{(equation 5)}$$

where the coefficients $a_j^i$ and b are nonlinear functions of all the signals that cause the distortion. In other words, each coefficient is a nonlinear fiction of the vector $$V_n = [v_n v_{n-\xi} v_{n-2\xi} \ldots v_{n-k\xi} \dot{v}_n \dot{v}_{n-\xi} \dot{v}_{n-2\xi} \ldots \dot{v}_{n-k\xi} v_{n-1} v_{n-2} v_{n-3} \ldots v_{n-k-1}].$$

Alternatively, the distortion function may be expressed as:

$$\eta_n = \tilde{a}_{0,n}(V_n) v_n + \ldots + \tilde{a}_{2N-2,n}(V_n) \mu_{n-2N+2} + \tilde{b}_n(V_n) \quad \text{(equation 6)},$$

where each coefficient $\tilde{a}_{k,n}(V_n)$ is a nonlinear function of $V_n$. In some embodiments, the coefficients of the distortion fiction are determined empirically. Test tones having varying amplitudes and slew rates are sent to the ADC. Least mean squared error approximation is performed on the results to determine the coefficients.

Figure 2:
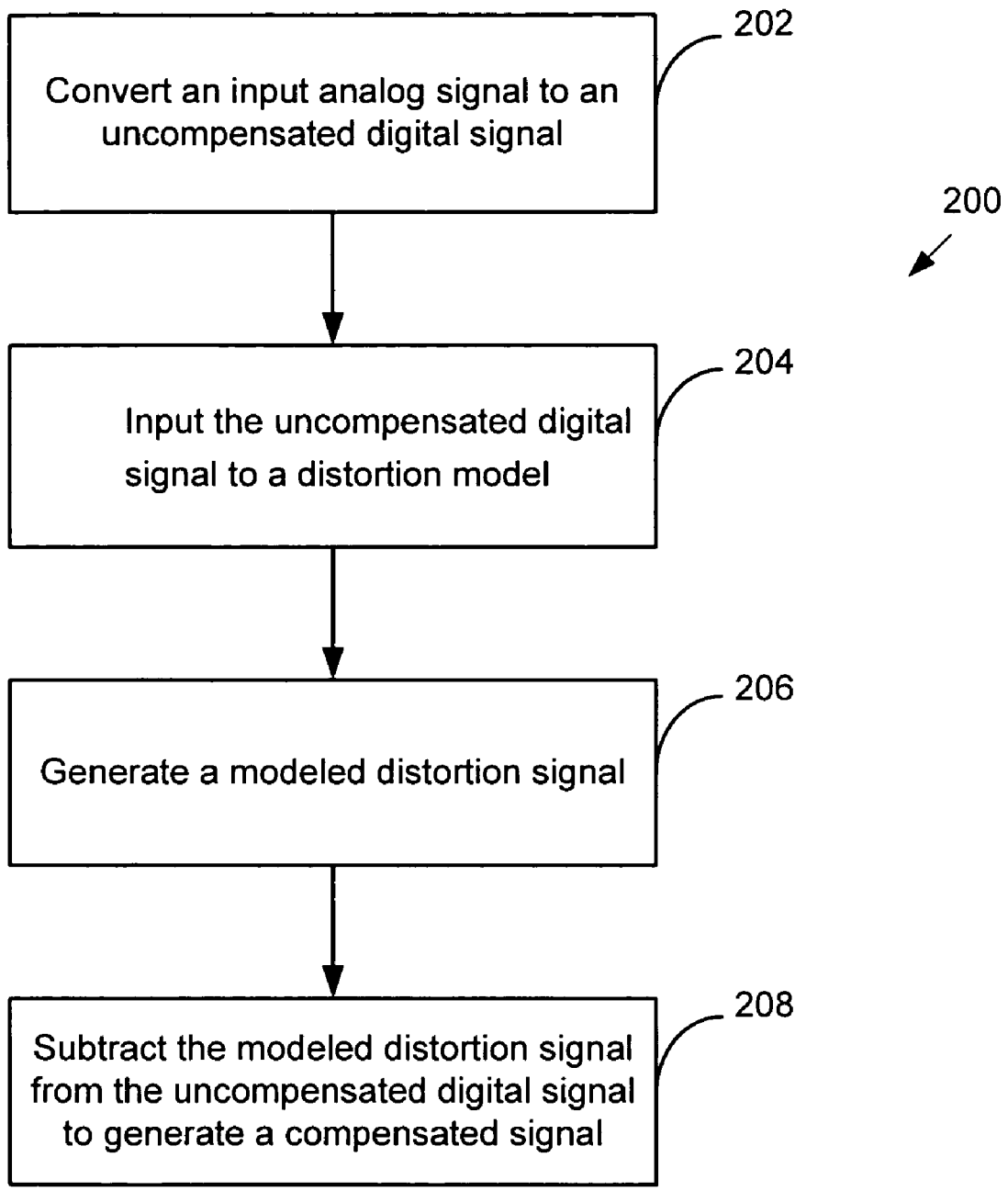
FIG. 2 is a flowchart illustrating the operations of a distortion correcting analog-to-digital converter embodiment.

FIG. 2 is a flowchart illustrating the operations of a distortion correcting analog-to-digital converter embodiment. In this example, an input analog signal is first converted to an uncompensated digital signal (202). The uncompensated digital signal is then input to a distortion model (204). In some embodiments, the distortion model is implemented as a filter similar to filter 120 of FIG. 1C. A modeled distortion signal is generated based on the uncompensated digital signal (206). The modeled distortion signal is subtracted from the uncompensated digital signal to generate a compensated signal (208).

Process 200 may be implemented by a system such as ADC 100 of FIG. 1A. In ADC 100, the input analog signal v is converted to an uncompensated digital signal $y_n$ by ADC 102. The uncompensated digital signal includes an ideal digital signal $v_n$ and a distortion component $\eta_n$. The uncompensated digital signal is sent to a distortion model 120 to generate a modeled distortion signal $\hat{\eta}_n$. $\hat{\eta}_n$ is then subtracted from $y_n$ to generate a compensated signal $\hat{v}_n$.

Figure 3A:
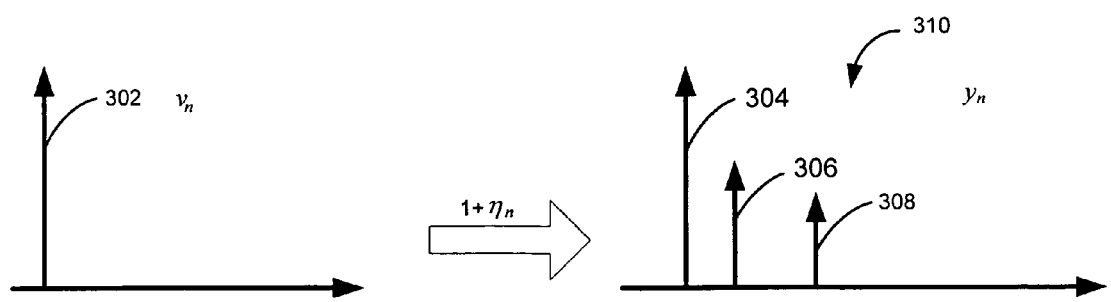
FIG. 3A-3C are frequency domain signal diagrams illustrating the effects of distortion and compensation.
Figure 3B:
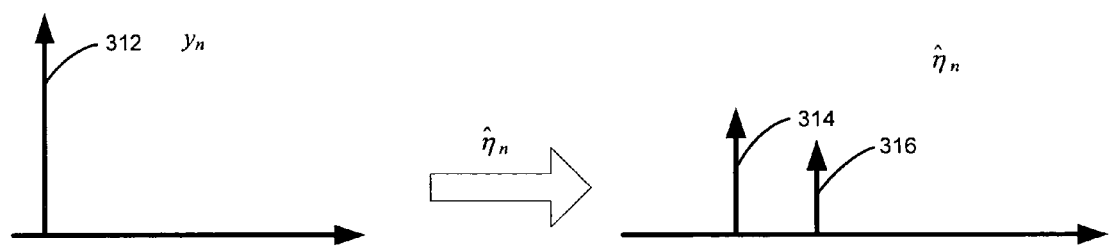
Figure 3C:
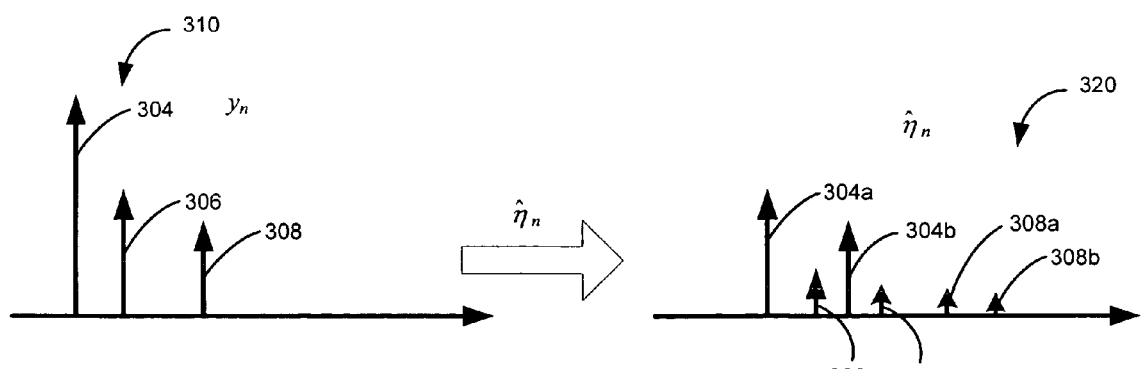

FIG. 3A-3C are frequency domain signal diagrams illustrating the effects of distortion and compensation. In FIG. 3A, input signal 84 $_n$ is transformed by function $1 + \eta_n$ to produce an output signal $y_n$. The transformation of input signal component 302 results in output signal 310, which includes a desired output component 304 and distortion harmonics 306 and 308. In FIG. 3B, an input signal $y_n$ is transformed by function $\hat{\eta}_n$ to generate estimated distortion. If signal component 312 is approximately the same as signal component 302, estimated distortion components 314 and 316 are expected to be approximately equal to signal components 306 and 308, respectively. In FIG. 3C, the distortion model $\hat{\eta}_n$ is applied to signal 310 of FIG. 3A.

The desired output signal 304 results in distortion signals 304a and 304b. Distortion component 306 results in distortion signals 306a and 306b. Similarly, distortion component 308 results in distortion components 308a and 308b. As shown in this diagram, applying a signal with distortion to the distortion model generates an estimated distortion comprised of distortion of the desired signal and distortions of the distortion component. As long as components such as 306a-b and 308a-b remain relatively small, estimated distortion signal 320 can be subtracted from distorted output 310 to generate a compensated output with significantly less distortion.

Figure 4A:
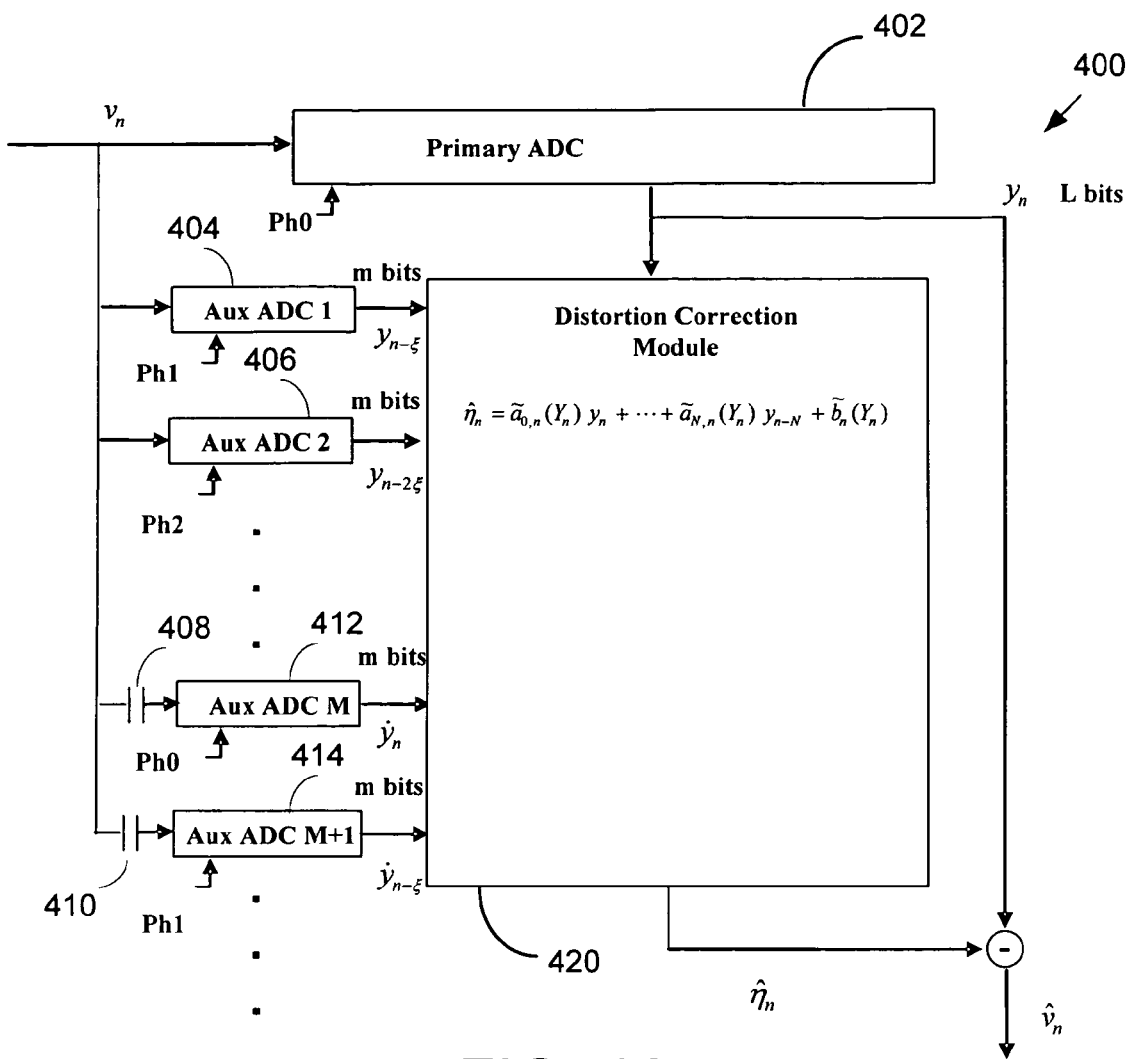
FIG. 4A is a block diagram illustrating the implementation of a distortion compensating analog-to-digital converter embodiment.

FIG. 4A is a block diagram illustrating the implementation of a distortion compensating analog-to-digital converter embodiment. ADC 400 of FIG. 4A includes a primary ADC 402 and a plurality of auxiliary ADCs such as 404 and 406. Some of the auxiliary ADCs such as 412 and 414 are coupled to capacitors. The primary and auxiliary ADCs are coupled to a distortion correction module 420. Primary ADC 402 samples the input signal $v_n$ and provides the required number of bits (denoted as L) for the overall ADC. Each of the auxiliary ADCs generates m bits of outputs. In some embodiments, m is less than L. For example, a 16 bit ADC may be implemented using a 16 bit primary ADC and a plurality of 8 bit auxiliary ADCs. Other bit values are possible in different embodiments.

Figure 4B:
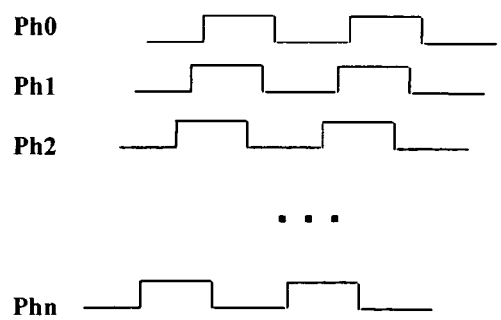
FIG. 4B illustrates the timing diagrams of some sampling clocks used by the primary and auxiliary ADCs.

ADCs are configured to sample the input signal at various phases. FIG. 4B illustrates the timing diagrams of some sampling clocks used by the primary and auxiliary ADCs. In this example, the sampling clock used by primary ADC 402 is referred to as phase zero clock (ph0) and the samples generated are referred to as the integral samples. An auxiliary ADC may sample its input using the same sampling clock or using a sampling clock that has a relative phase offset with respect to the phase zero clock. The sampling clock with a relative phase offset is referred to as a fractional phase sampling clock (e.g. ph1, ph2 and phn). Other fractional phase sampling clocks may be used as well.

Returning to FIG. 4A, an auxiliary ADC such as 404 may sample the input at fractional intervals between the integral samples to generate fractional phase samples. In the example shown, the fractional phase sampling clocks used by auxiliary ADCs 404 and 406 differ by a phase $\xi$. For each integral sample $y_n$ generated by the primary ADC, ADCs 404 and 406 generate fractional phase samples $y_{n-\xi}$ and $y_{n-2\xi}$, respectively. The input signal is also sent to capacitors such 408 and 410 for generating derivatives of the input signal. Auxiliary ADCs such as 412 and 414 sample the derivatives using the phase zero sampling clock or specified fractional phase sampling clocks to provide derivative samples $\dot{y}_n$, $\dot{y}_{n-\xi}$, etc.

Figure 4C:
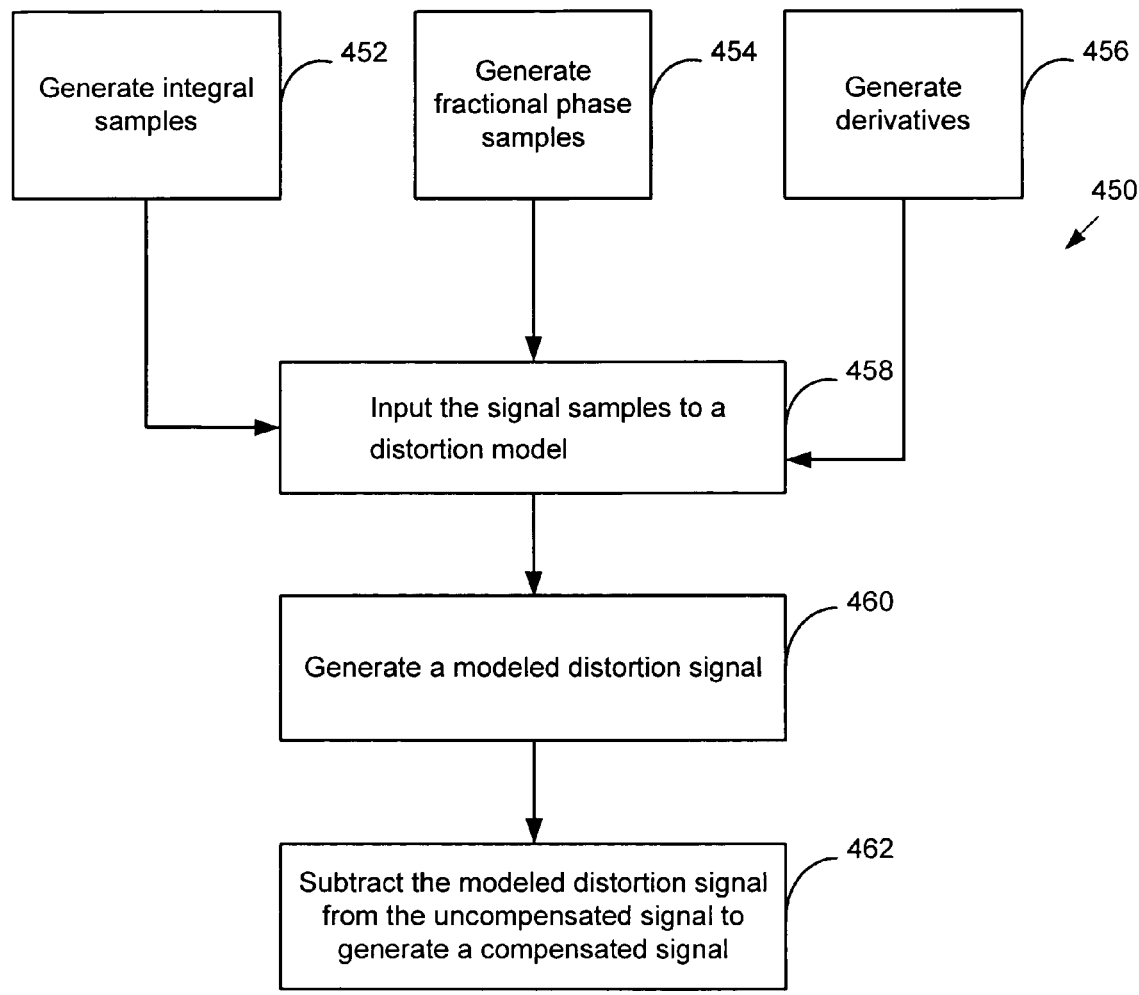
FIG. 4C is a flowchart illustrating a process embodiment for compensating an analog input signal.

FIG. 4C is a flowchart illustrating a process embodiment for compensating an analog input signal. In this example, process 450 may be implemented on ADC 400 of FIG. 4A. Integral samples are generated based on the analog input signal (452). In this case, the integral samples form the uncompensated signal. Optionally, fractional phase samples and/or derivative samples are also generated (454, 456). The signal samples are input into a distortion model (458). A modeled distortion signal is generated by the distortion model, based on the integral, fractional and/or derivative samples (460). The modeled distortion signal is subtracted from the uncompensated integral samples to generate a compensated signal (462).

The distortion correction module implements a distortion model with the following transfer function:

$$\hat{\eta}_n = \tilde{a}_{0,n}(Y_n)y_n + \ldots + \tilde{a}_{N,n}(Y_n)y_{n-N} + \tilde{b}_n(Y_n) \qquad \text{(equation 7),}$$

where $Y_n$ is a vector including the integral samples, the fractional samples, and the derivatives. An example of $Y_n$ is $$Y_n = [y_n y_{n-\xi} y_{n-2\xi} \dot{y}_n \dot{y}_{n-\xi} \dot{y}_{n-2\xi} y_{n-1} y_{n-2} y_{n-3}].$$

Equation 7 can be viewed as a "linear" convolution between the input variables and the nonlinear coefficients that are time variant nonlinear functions of the input signal. In other words, the fiction has the form of a linear filter, but with nonlinear coefficients. The relative location of input $Y_n$ in the multi-dimensional input space determines the values of the $\tilde{a}_{j,n}$ and $\tilde{b}_n$ coefficients. The dependence of the filter coefficient values on the input signal vector gives the filter its nonlinear property.

The nonlinear processor output, $\hat{v}_n$, includes a replica of the original linear signal $v_n$ and the residual uncorrected nonlinear distortion $\tilde{\eta}_n$. The relationship may be expressed as:

$$\hat{v}_n = y_n - \hat{\eta}_n = v_n + \eta_n - \hat{\eta}_n = v_n + \tilde{\eta}_n \qquad \text{(equation 8),}$$

where $$\tilde{\eta}_n = \eta_n - \hat{\eta}_n. \qquad \text{(equation 9).}$$

By using the fractional samples and the fractional derivative samples, the distortion correction module can better predict the distortion of the signal. The estimated distortion is then subtracted from the output of the primary ADC to provide a compensated output.

Figure 5A:
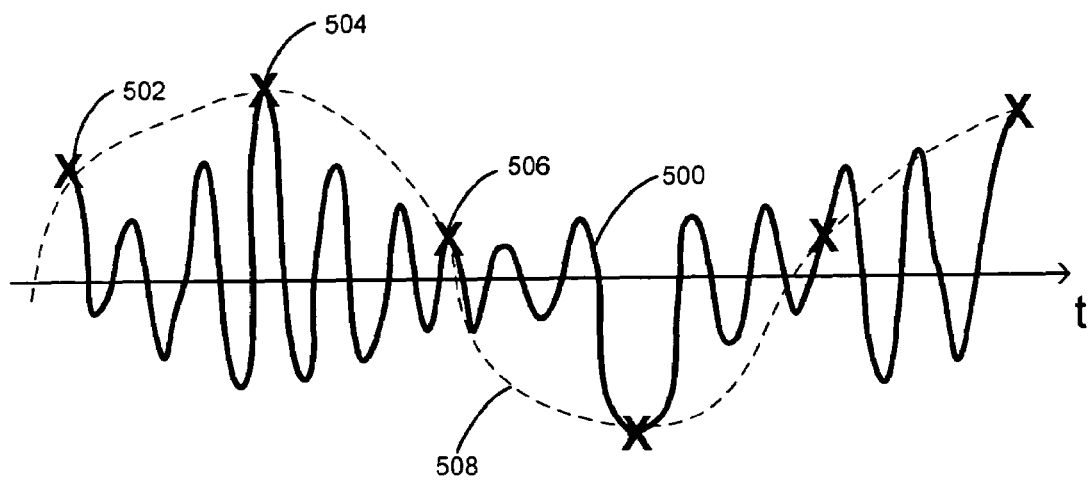
FIGS. 5A-5C are signal diagrams illustrating the operations of a of a eating analog-to-digital converter such as ADC 400.
Figure 5B:
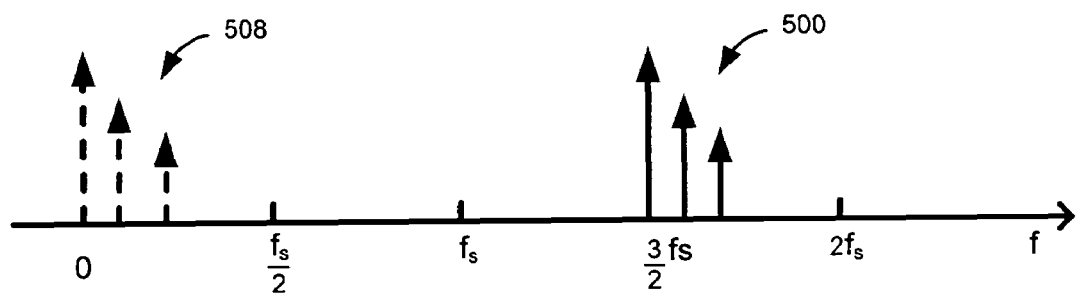
Figure 5C:
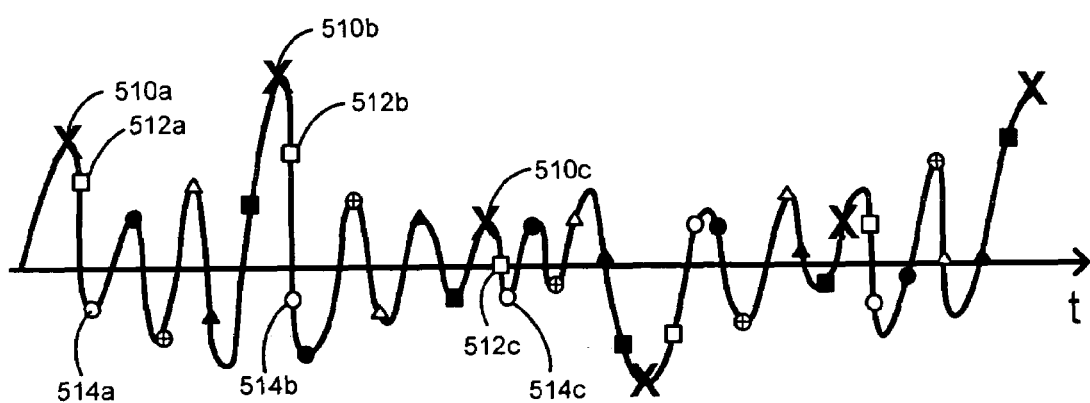

FIGS. 5A-5C are signal diagrams illustrating the operations of a compensating analog-to-digital converter such as ADC 400. FIG. 5A is a time domain diagram illustrating the sampling effects of the primary ADC. A modulated input 500 is sampled at intervals 502, 504, 506, etc. Sampling by the primary ADC demodulates the higher frequency input signal to a lower frequency. In this case, the input signal is sub-sampled and demodulated to baseband. The samples can be interpolated to form a demodulated baseband signal 508. The sampling effects in the frequency domain are shown in FIG. 5B. Sampling signal 500 at intervals shown in FIG. 5A downshifts the signal to baseband, resulting in signal 508.

In the examples shown, a distortion correction module relies on the samples to generate an estimated distortion signal. Since the distortion model is dependent on the history of the signal and its derivatives, the model can provide better distortion estimation if more detailed information between the sampled points is available. For example, more input data history and better derivative values can be used to improve the distortion model output. In FIG. 5C, the primary ADC provides samples such as 510a, 510b, 510c, etc. The auxiliary ADCs sample the input at fractional sampling phases. For example, fractional phase sample 512a, 512b and 512c are generated by an auxiliary ADC sampling at fractional sampling phase Ph1. Similarly, another auxiliary ADC sampling at fractional sampling phase Ph2 generates samples 514a, 514b, 514c, etc. The derivatives may be computed based on the fractional phase samples. Together, the fractional samples and/or derivatives are used by the distortion model to provide more accurate distortion estimation.

Figure 6A:
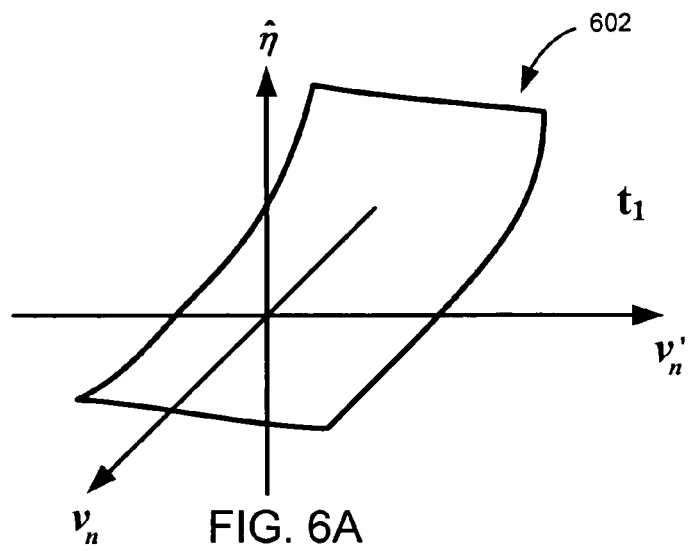
FIGS. 6A-6C illustrate manifolds of the distortion function for several different temperatures.
Figure 6B:
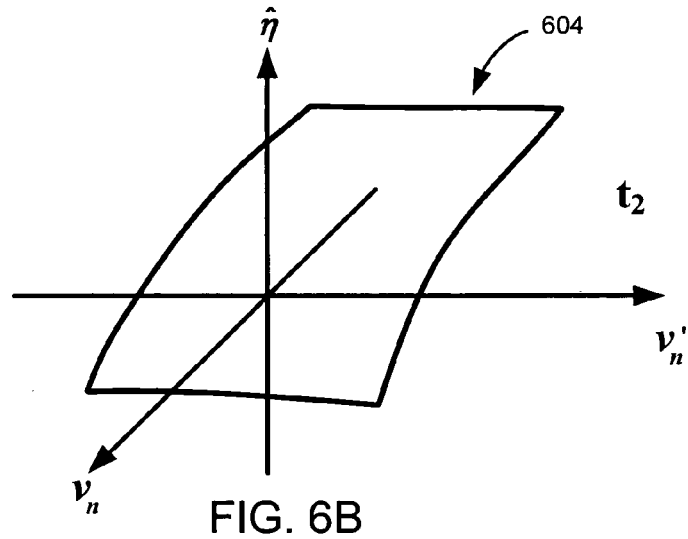
Figure 6C:
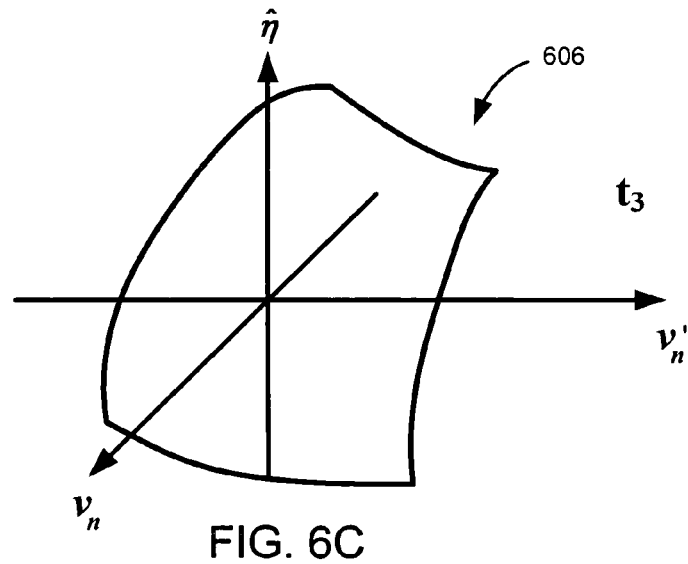

In some systems, the distortion model also depends on system temperature. In FIGS. 6A-6C, manifolds of the distortion function for three different temperatures $T_1, T_2,$ and $T_3$ are illustrated. The coefficients of the distortion model at different temperatures are determined based on measurements and stored. During operation, the coefficients corresponding to the operating temperature is selected to construct an appropriate distortion correction filter. In some embodiments, the operating temperature is used to analytically determine the corresponding coefficients. For example, a processor or computation block may extrapolate several measurements at different temperatures to derive coefficients that correspond to a temperature without existing measurements. During operation, the coefficients are computed based on a function of the input and its history, the derivatives of the input, the temperature, the changes in temperature, any other appropriate factors or a combination thereof.

In some embodiments, a distortion model similar to equation 7 can be implemented using one or more minimum-maximum processors and/or absolute value processors. Details of the implementation are described in U.S. Pat. No. 6,856,191, entitled NONLINEAR FILTER, which is incorporated herein by reference for all purposes. According to the techniques described, the transfer function of the distortion model may be expressed as:

$$\hat{\eta}_n = A^T Y_n + b + \sum_{j=1}^{K} c_j |\vec{\alpha}_j Y_n + \beta_j|. \quad \text{(equation 10)}$$

Let sign $(\vec{\alpha}_j Y_n + \beta_j) = \lambda_{jn}$, equation 10 can be rewritten as:

$$\hat{\eta}_n = \left(a_0 + \sum_{j=1}^{K} c_j \alpha_{0j} \lambda_{jn}\right) y_n + \ldots + \quad \text{(equation 11)}$$

$$\left(a_N + \sum_{j=1}^{K} c_j \alpha_{N,j} \lambda_{jn}\right) y_{n-N} + \left(b + \sum_{j=1}^{K} c_j \beta_j \lambda_{jn}\right).$$

Equation 11 is also equivalent to equation 7.

The distortion function may be transformed into vector form to simplify the function and achieve computational reductions. In some embodiments, the distortion function is implemented as a low complexity filter with reduced number of multiplication operations. The distortion function of equation 4 can be transformed as follows:

$$\hat{\eta}_n = A^T Y_n + b + \sum_{j=1}^{K_1} c_j |y_n + \beta_j| + \quad \text{(equation 12)}$$

$$\sum_{j=K_1+1}^{K_2} c_j |y_{n-1} + \beta_j| \ldots +$$

$$\sum_{j=K_{2N-3}+1}^{K_{2N-2}} c_j |y_{n-N} + \beta_j|$$

$$= A^T Y_n + b + \sum_{j=1}^{K_1} c_j \lambda_{j,n}(y_n + \beta_j) +$$

$$\sum_{j=K_1+1}^{K_2} c_j \lambda_{j,n}(y_{n-1} + \beta_j) \ldots +$$

$$\sum_{j=K_{2N-3}+1}^{K_{2N-2}} c_j \lambda_{j,n}(y_{n-N} + \beta_j).$$

Let $\lambda_{j,n} = \text{sign}(y_{n-1} + \beta_j)$, the function can be further transformed as $$\hat{\eta}_n = \left(a_0 + \sum_{j=1}^{K_1} c_j \lambda_{jn}\right) y_n + \ldots + \quad \text{(equation 13)}$$

$$\left(a_{2N-2} + \sum_{j=K_{2N-3}+1}^{K_{2N-2}} c_j \lambda_{jn}\right) y_{n-N} + \left(b + \sum_{j=1}^{K} c_j \beta_j \lambda_{jn}\right).$$

A filter implementing the general form of equation 13 is referred to as a first order nonlinear filter since each coefficient is multiplied with terms of y to the first order at most. In some embodiments, $c_j$ and $c_j \beta_j$ are pre-computed and stored. Since $\lambda_{jn}$ is either 1 or −1, the coefficients can be computed without using multiplication and the complexity in filter implementation is greatly reduced.

Other simplifications using vector manipulation are also possible. For example, another simplified form of the distortion function is expressed as:

$$\hat{\eta}_n = \tilde{f}_{0,n}(Y_n) y_n + \ldots + \tilde{f}_{2N-2,n}(Y_n) y_{n-2N+2} + \tilde{a}_{0,n}(Y_n) y_n + \\ \ldots + \tilde{a}_{2N-2,n}(Y_n) y_{n-2N+2} + \tilde{b}_n(Y_n) \quad \text{(equation 14),}$$

where each $f_{k,n}(Y_n)$ is a first order nonlinear function $$f_{k,n}(Y_n) = A_k^T Y_n + b_k + \sum_{j=1}^{K} c_j^k |\vec{\alpha}_j^k Y_n + \beta_j^k| = \quad \text{(equation 15)}$$

$$\tilde{a}_{0,n}^k(Y_n) y_n + \ldots + \tilde{a}_{2N-2,n}^k(Y_n) y_{n-2N+2} + \tilde{b}_n^k(Y_n).$$

Accordingly, each coefficient in equation 14 is a nonlinear function of the input vector elements and some of the coefficients multiply a power-of-two element of the input vector or cross-product-of-two elements of the input vector. A filter implementing this simplified form is referred to as a second order filter.

In some embodiments, the distortion function is simplified to have constants in each discrete input region. This simplification results in a zero order transfer function. The zero order filter is sometimes referred to as a "catastrophic" structure because of the discontinuities in the filter response. A general form of a zero order nonlinear filter is expressed as:

$$\hat{\eta}_n = a_0 + a_1 + \ldots + a_{2N-2} + b + \quad \text{(equation 16)}$$

$$\sum_{j=1}^{K} c_j^0 \lambda_j^0 + \sum_{j=1}^{K} c_j^1 \lambda_j^1 + \ldots + \sum_{j=1}^{K} c_j^{2N-2} \lambda_j^{2N-2}.$$

To implement a zero order nonlinear filter, combinations of $$\sum_{j=1}^{K} c_j^0 \lambda_{jn}^0, \sum_{j=1}^{K} c_j^1 \lambda_{jn}^1,$$

etc. may be pre-computed, stored and retrieved based on the appropriate input.

In some embodiments, the coefficient value is determined using an indicator that indicates the relative location of the input within the range of possible inputs. The indicator is sometimes referred to as a "thermometer code," which is a vector having a total of at most one sign change among any two adjacent elements.

Take the following second order function as an example:

$$\hat{\eta}_n = a_0 y_n + a_1 y_{n-1} + b + \sum_{j=1}^{K} c_j^0 |y_n + \beta_j^0| y_n +$$

$$\sum_{j=1}^{K} c_j^1 |y_{n-1} + \beta_j^1| y_n$$

$$= \left(\sum_{j=1}^{K} c_j^0 \lambda_j^0\right) y_n^2 + \left(\sum_{j=1}^{K} c_j^1 \lambda_j^1\right) y_n y_{n-1} +$$

$$\left(a_0 + \sum_{j=1}^{K} c_j^0 \lambda_j^0 \beta_j^0 + \sum_{j=1}^{K} c_j^1 \lambda_j^1 \beta_j^1\right) y_n + a_1 y_{n-1} + b$$

$$= \tilde{a}_{01,n} y_n^2 + \hat{a}_{1,n} y_n y_{n-1} + \tilde{a}_{0,n} y_n + a_{1,n} y_{n-1} + b.$$

(equation 17)

The input is compared to the set of $\beta_j^K$ values to determine the relative location of the input variable within the range of possible inputs, and the vector of $\lambda_{j,n}$, denoted as $\Lambda_n$. Depending on the input, $\Lambda_n$ may be a vector with terms that are +1 only, −1 only, or −1 for the first k terms and +1 for the rest of the terms. In other words, $\Lambda_n$ is a thermometer code with at most one sign change among its terms. For example, assuming that constants $\beta_j^K$ are distributed across the dynamic range of $y_n \in (-1, 1)$ and there are 8 values of $$\beta_j^k \in \left(-\frac{4}{7} - \frac{3}{7} - \frac{2}{7} - \frac{1}{7} \frac{1}{7} \frac{2}{7} \frac{3}{7} \frac{4}{7}\right).$$

If $$y_n < -\frac{4}{7},$$

then $\Lambda_n = [-1 -1 -1 -1 -1 -1 -1 -1]$. If $$y_n > \frac{4}{7},$$

then $\Lambda_n = [+1 +1 +1 +1 +1 +1 +1 +1]$. If $y_n$ is somewhere in between, $\Lambda_n$ may have a sign change. For example, if $$y_n = -\frac{3.5}{7},$$

then $\Lambda_n = [-1 -1 -1 -1 -1 -1 -1 +1]$. If $$y_n = \frac{1.5}{7},$$

then $\Lambda_n = [-1 -1 -1 +1 +1 +1 +1 +1]$. Since the thermometer code has only 8 values, there are only 8 possible values for $$\tilde{a}_{01,n} = \sum_{j=1}^{K} c_j^0 \lambda_j^0,$$

8 possible values for $$\hat{a}_{1,n} = \sum_{j=1}^{K} c_j^1 \lambda_{j,n}^1,$$

and 64 possible values for $$\tilde{a}_{0,n} = a_0 + \sum_{j=1}^{K} c_j^0 \lambda_j^0 \beta_j^0 + \sum_{j=1}^{K} c_j^1 \lambda_j^1 \beta_j^0.$$

The number of add operations can be reduced by pre-computing the possible values for coefficients of $\tilde{a}_{01,n}$, $\hat{a}_{1,n}$, etc. and storing them in memory. In this example, the addresses of the coefficients are stored in a lookup table, which stores the 8 possibilities of thermometer code $\Lambda_n$ and the corresponding addresses of pre-computed coefficients. The coefficients can be retrieved by accessing the memory addresses that correspond to the appropriate thermometer code entry. Once the coefficients $\tilde{a}_{01,n}$, $\hat{a}_{11,n}$ etc... are read out of memory, the filter output can be computed as $$\hat{\eta}_n = \tilde{a}_{01,n} y_n^2 + \hat{a}_{1,n} y_n y_{n-1} + \tilde{a}_{0,n} y_n + a_{1,n} y_{n-1} + b \quad \text{(equation 18)}.$$

This technique is also applicable to zero, first or higher order filters.

Low complexity nonlinear filters may be implemented based on the simplified forms. In some embodiments, the low complexity linear filter includes a processor coupled to the nonlinear filter, configured to determine the relative location of the input variable within a range of possible inputs and to determine a filter coefficient of the nonlinear filter using the relative location of the input variable. The filter coefficients can be determined without using multiplication operations. In some embodiments, filter coefficients for zero order, first order, second order and/or higher order filters are pre-computed, stored and retrieved when appropriate. Higher order filters can be formed by nesting lower order filters. Details of implementing a nonlinear transfer function using low-complexity filter or thermometer code are described in U.S. patent application Ser. No. 11/061,850 entitled LOW-COMPLEXITY NONLINEAR FILTERS, filed Feb. 18, 2005, which is incorporated herein by reference for all purposes.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of obtaining a compensated digital signal from an input analog signal, comprising:
   converting the input analog signal to an uncompensated digital signal;
   inputting the uncompensated digital signal to a distortion model, wherein the distortion model has a transfer function that includes a nonlinear coefficient;

generating a modeled distortion signal; and generating the compensated digital signal based at least in part on the uncompensated digital signal and the modeled distortion signal.

2. A method of obtaining a compensated digital signal from an input analog signal, comprising:

converting the input analog signal to an uncompensated digital signal;

sampling the input analog signal using a fractional phase sampling clock to obtain a fractional phase sample;

inputting the uncompensated digital signal and the fractional phase sample to a distortion model;

generating a modeled distortion signal; and generating the compensated digital signal based at least in part on the uncompensated digital signal and the modeled distortion signal.

3. A method of obtaining a compensated digital signal from an input analog signal, comprising:

converting the input analog signal to an uncompensated digital signal;

generating a derivative of the input analog signal;

inputting the uncompensated digital signal and the derivative to a distortion model;

generating a modeled distortion signal;

generating the compensated digital signal using the uncompensated digital signal and the modeled distortion signal.

4. A distortion compensating analog to digital converter (ADC), comprising:

an uncompensated ADC configured to convert an input analog signal to an uncompensated digital signal;

a compensation module coupled to the uncompensated ADC, wherein the compensation module has a transfer function that includes a nonlinear coefficient, and is configure to:

receive the uncompensated digital signal;

generate a modeled distortion signal; and generate the compensated digital signal based at least in part on the uncompensated digital signal and the modeled distortion signal.

5. A distortion compensating analog to digital converter (ADC), comprising:

an uncompensated ADC configured to convert an input analog signal to an uncompensated digital signal;

a compensation module coupled to the uncompensated ADC, wherein the compensation module is configure to:

sample the input analog signal using a fractional phase sampling clock to obtain a fractional phase sample;

receive the uncompensated digital signal;

generate a modeled distortion signal at least in part using the fractional phase sample; and generate the compensated digital signal based at least in part on the uncompensated digital signal and the modeled distortion signal.

6. A distortion compensating analog to digital converter (ADC), comprising:

an uncompensated ADC configured to convert an input analog signal to an uncompensated digital signal;

a compensation module coupled to the uncompensated ADC, wherein the compensation module is configure to:

receive the uncompensated digital signal;

generate a derivative of the input analog signal;

generate a modeled distortion signal based at least in part on the derivative; and generate the compensated digital signal based at least in part on the uncompensated digital signal and the modeled distortion signal.

* * * * *